United States Patent [19]
Wada et al.

[11] Patent Number: 4,794,688
[45] Date of Patent: Jan. 3, 1989

[54] METHOD OF CONNECTING SUPERCONDUCTING WIRES

[75] Inventors: Takeshi Wada; Hisanao Kita, both of Hitachi; Yoshinori Karatsu, Takahagi; Yoji Akutsu, Hitachi, all of Japan

[73] Assignee: Hitachi, Ltd., Tokyo, Japan

[21] Appl. No.: 35,033

[22] Filed: Apr. 6, 1987

[30] Foreign Application Priority Data

Apr. 4, 1986 [JP] Japan ................................. 61-77753

[51] Int. Cl.$^4$ ............................................. H01L 39/29
[52] U.S. Cl. ........................................ 29/599; 29/869; 179/125.1
[58] Field of Search .................. 29/871, 869, 868, 872; 174/126 S

[56] References Cited

U.S. PATENT DOCUMENTS

| | | | |
|---|---|---|---|
| 2,845,521 | 7/1958 | Trickle, Jr. | 29/869 X |
| 4,518,445 | 5/1985 | Pedersen et al. | 29/868 X |
| 4,558,512 | 12/1985 | Chaussy et al. | 29/871 X |
| 4,631,808 | 12/1986 | Jones | 29/871 X |
| 4,673,774 | 6/1987 | Wake et al. | 29/868 |

FOREIGN PATENT DOCUMENTS

8002084 10/1980 PCT Int'l Appl. ................. 29/871

Primary Examiner—Timothy V. Eley
Assistant Examiner—Carl J. Arbes
Attorney, Agent, or Firm—Antonelli, Terry & Wands

[57] ABSTRACT

A method of connecting superconducting wires have the steps of preparing a connecting superconducting wire piece, exposing the filaments of the superconducting layers to be connected and the filaments of the connecting superconducting wire piece by partially dissolving and removing the coating layers, inserting the filaments of the superconducting wires to be connected into the filaments of the connecting superconducting wire piece such that the filaments of the connecting superconducting wire piece cross and envelope the filaments of the superconducting wires to be connected, fitting a metallic connecting pipe on the region where the filaments cross each other, and crimping the metallic connecting pipe onto the crossing filaments thereby tightly fixing and connecting the exposed filaments to each other.

9 Claims, 8 Drawing Sheets

METHOD OF CONNECTING SUPERCONDUCTING WIRES

BACKGROUND OF THE INVENTION

1. Field of the Invention

The present invention relates to a method of connecting superconducting wires, each having a plurality of filament cores embedded in a stabilizing coating. More specifically, the present invention is concerned with a method for connecting the filament cores without impairing the high conductivity in the connected filament cores.

2. Description of the Prior Art

Superconducting wires are finding widespread use in various apparatus such as nuclear fusion experiment systems, nuclear magnetic resonance computers(NMR), tomographic devices(CT) and so forth. Generally, the length of superconducting wires is limited mainly for the reasons concerning the production thereof. In addition, superconducting machines are usually composed of a plurality of units which are fabricated separately and then assembled together. This essentially requires connection between superconducting wires of a predetermined length without impairing the superconductivity of such wires.

Hitherto, the connection between superconducting wires has been achieved by various methods such as brazing, press-bonding and welding. These conventional methods, however, inevitably increases the electric resistance at the connecting portions, resulting in an increased rate of heat generation and, hence, an increased consumption of liquid helium which is used as the cooling medium. This inconveniently makes it difficult to design and construct superconducting equipment having a large capacity.

In order to obviate this problem, a method is disclosed in Japanese Patent Application Laid-Open No. 16207/1984 for connecting superconducting wires. In this method, as shown in FIG. 23, the stabilizing coating of the superconducting wires 101, 102 to be connected to each other is removed to expose the super-conducting filaments 103 and 104, and the thus exposed superconducting filaments 103 and 104 are superposed on each other and placed in a connecting pipe 107. The connecting pipe 107 is then pressed so that the superconducting filaments 103 and 104 are press-bonded to each other. According to this method, however, the superconducting filaments 101 and 102 are connected to each other only at their contacting outer surfaces, so that the connection between the superconducting wires cannot have a large critical current value.

Another problem encountered by this method is that, when the superconducting filaments 103 and 104 are pressed through the connecting pipe 107, the filaments in the vicinity of the region where both wires contact each other are bent inwardly substantially to the central region and rigidly held in this state. The thus bent filaments are subjected to tensile force with the greatest bending appearing at the portions of the filaments where they are exposed from the stabilizing coating. In consequence, the filaments tend to break due to a large degree of bending, and the characteristics of the superconducting wire tends to be deteriorated as a result of the work caused by the application of the pressing force. This in turn causes the critical current value at the juncture between the superconducting wires to fluctuate or to be decreased to a level which is much smaller than that offered by the elementary superconducting wire. The unfavourable effect such as breakage of the wires and deterioration in the characteristics due to excessive deformation caused by the press work can be reduced if the pressure applied to the connecting pipe 107 is decreased. In such a case, however, the closeness of the contact between the superconducting filaments 103 and 104 is impaired which causes an increase the contact resistance, resulting in an increased rate of heat generation.

The other methods are disclosed in Japanese patent application Laid-Open No. 165206/1981 and No. 60908/1984 for connecting superconducting wires. These methods, also, have posed some problems as well as those of the above method.

Thus, the conventional method for connecting superconducting wires requires delicate control or adjustment the step of exposing a surface of exposure of the superconducting conducting filaments to be connected, the step of overlapping the filaments, to be connected and the step of deforming the filaments caused by the press work.

SUMMARY OF THE INVENTION

Accordingly, an object of the present invention is to provide a method of connecting superconducting wires in which the superconducting wires are connected through the intermediary of a separate superconducting connecting wire piece, thus attaining a high strength in the connection and maintaining a high level of critical current, thereby overcoming the above-described problems of the prior art.

To this end, according to the present invention, there is provided a method of connecting superconducting wires each of which has a plurality of filaments covered by a coating layer, comprising the steps of causing exposed filaments of a connecting superconducting wire piece to cross and surround the exposed filaments of the superconducting wires to be connected; covering the region where the filaments mesh each other by a metallic connecting pipe; and crimping the metallic connecting pipe by a pressure thereby firmly connecting the filaments of the superconducting wires to each other.

The construction of the connecting portion is so determined as not to cause any excessive bending of the filaments of the connecting superconducting wire piece and breakage of these filaments at the point where the filaments emerging emerge from the end of the stabilizing coating. In addition, a brazing portion is provided besides the press-bonding portions so as to prevent, by making use of the shunting of the electric current, any excessive concentration of current to the filament portions in the press-bonded portions and breakage of the filaments which may otherwise be caused by an excessive concentration of the electric current. A more remarkable effect will be obtained if the connecting superconducting wire piece has a critica current value which is greater than those of the superconducting wires to be connected.

The filaments of the connecting superconducting wire piece provide a certain buffering effect which suppresses any torsion, twisting and bending of the superconducting wires which may be caused by the application of pressure. In addition, the use of the connecting superconducting wire piece permits the pressing force to be increased. For these reasons, the methods of the present invention can attain a greater closeness of contact while avoiding any risk of the filaments being broken.

Preferably, the length of the exposed portion of the filaments of the superconducting wire piece is adjusted such that this portion can envelope the end of the stabilizing coating of the adjacent superconducting wire, and the press-bonding is conducted after arranging the filaments of the connecting superconducting wire piece and the superconducting wire cross each other. In such a case, the crossed filaments produce a certain buffer effect so as to prevent breakage of the filaments at their portions where they emerge from the stabilizing coating.

According to the present invention, the superconducting wires are connected by brazing at portions different from the press-bonded portion. When an electric current in excess of the critical current of the press-bonded portion is applied to the press-bonded portion, superconductivity is lost in the press-bonded portion causing electric resistance to be produced in the press-bonded portion. In consequence, heat is generated creating a risk that the filaments may be burnt. This problem, however, is overcome by the method of the present invention in that the electric current shunts to the brazed portion so as to avoid concentration of the electric current at the press-bonded portion.

Each of the superconducting wires to be connected are immersed in a thick solution of nitric acid at a predetermined length so as to dissolve and remove the stabilizing coating thus exposing the filaments.

If the end surface of the stabilizing coating after the dissolution exhibits a concaved form, a keen edge is rubbed along the peripheral surface of the coating. This keen edge undesirably promotes the tendency of breakage of the filaments, because the filaments are rubbed against the keen edge or buckled around this keen edge. It is, therefore, important that the dissolution be conducted such that the end surface of the stabilizing coating is convexed, thereby eliminating nay problems which may otherwise be caused by the keen edge.

DESCRIPTION OF THE PREFERRED EMBODIMENTS

Preferred embodiments of the present invention will be described with reference to the accompanying drawings.

FIRST EMBODIMENT

FIGS. 1A to 3 show a first embodiment of the present invention. As the first step, a pair of superconducting wires 1, 2 which are specified in the upper row of Table 1 are immersed in a thick solution of nitric acid so that the stabilizing coating layers are dissolved and removed to expose superconductive filaments over a predetermined length. During this treatment, the immersion time is adjusted such that the central portion of the stabilizing copper is not dissolved, thus causing the end surface of the stabilizing copper to exhibit a conically projected form.

TABLE 1

| | DIAMETER | STABILIZING MATERIAL | COPPER RATIO | FILAMENTS |
|---|---|---|---|---|
| SUPERCONDUCTING WIRES | 1 mm | Cu | 7 | 50 μm × 50 |
| CONNECTING SUPERCONDUCTING WIRE PIECE | 75 mm | Cu | 1 | 35 μm × 1060 |

Then, the exposed filaments 3 and 4 of both superconducting wires are extended in parallel with each other.

Meanwhile, a connecting superconducting wire piece 5 which is specified in the lower row of Table 1 is prepared. The connecting superconducting wire piece 5 has a diameter greater than that of the superconducting wires 1, 2 to be connected or has a greater maximum allowable current capacity than the superconducting wires 1 and 2. The connecting superconducting wire piece 5 also is immersed in the solution so as to expose the filaments 6 leaving a suitable length of the stabilizing coating so as to prevent the filaments from being disassembled.

Figure 1A:
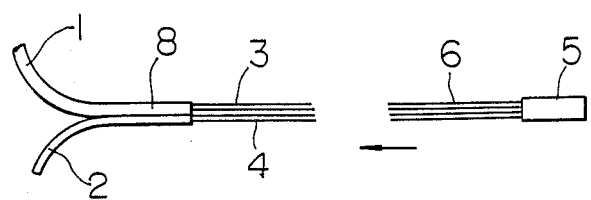
FIGS. 1A to 1C are sectional views illustrating successive steps of a first embodiment of the method in accordance with the invention for connecting superconducting wires.
Figure 1B:
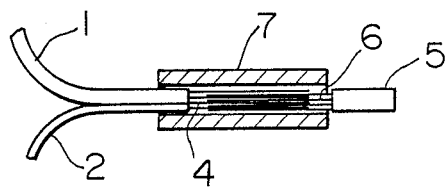
Figure 1C:
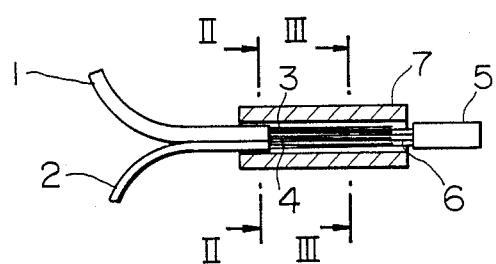

The superconducting wires 1 and 2 are laid aside such that their filaments 3 and 4 extend in a side-by-side fashion, and the filaments 6 of the connecting superconducting wire piece 5 are inserted such that they cross and envelope the filaments 3 and 4 of the superconducting conducting wires 1 and 2, as shown in FIG. 1B. Then, a connecting pipe 7 made of a metal such as copper is fitted to enclose the meshing filaments 3, 4 and 6 as shown in FIG. 1C and the connecting pipe 7 is collapsed by a suitable pressing tool so as to press-bond the filaments 3, 4 and 6 to each other, thus attaining a high degree of closeness and tightness of contact between these filaments. For the purpose of clarification of the drawings, the state after the crimping or collapsing of the connecting pipe 7 is omitted from the drawings as shown in the steps.

Figure 2:
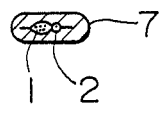
FIG. 2 is a sectional view taken along the line II—II of FIG. 1C.
Figure 3:
FIG. 3 is a sectional view taken along the line III—III of FIG. 1C.

FIG. 2 is a sectional view showing the superconducting wires 1 and 2 press-bonded and connected by the crimped connecting pipe 7 in accordance with the method described above, take along the line II—II of FIG. 1C, while FIG. 3 is a sectional view showing the filaments 3, 4 and 6 press-bonded and connected by the crimped connecting pipe 7 in accordance with the method described above, taken along line III—III of FIG. 1C.

SECOND EMBODIMENT

Figure 4:
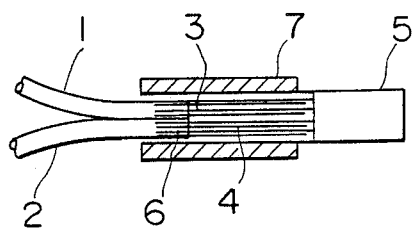
FIG. 4 is a sectional view showing the state of connection between superconducting wires connected by a second embodiment of the method in accordance with the present invention.

FIG. 4 shows a second embodiment of the present invention. This second embodiment is basically the same as the first embodiment but is distinguishable from the first embodiment in that the filaments 6 of the connecting superconducting wire piece 5 are exposed over a length which is large enough to enable the end of the exposed filaments 6 to cover the end portions of the stabilizing coating layers of the respective superconducting wires 1 and 2 to be connected. In this assembly, the metallic connecting pipe 7 is crimped such that the end of the metallic connecting pipe 7 projects about 0.5 mm beyond the end extremity of the filaments 6 of the connecting superconducting wire piece 5. According to this arrangement, the filaments 6 are interposed between the stabilizing coating layer of the superconducting wires 1, 2 and the end of the metallic connecting pipe 7. With this arrangement, it is possible to protect the superconducting wires 1 and 2 against any damage which may otherwise be caused by the keen corner edge of the metallic connecting pipe 7 when the latter is crimped.

THIRD EMBODIMENT

Figure 5:
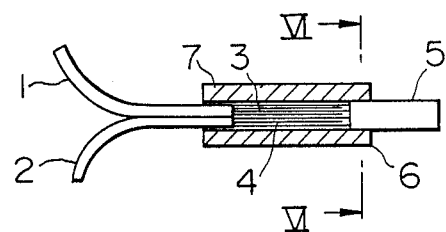
FIG. 5 is a sectional view showing the state of connection between superconducting wires connected by a third embodiment of the method in accordance with the present invention.

FIG. 5 shows a third embodiment of the present invention. In this embodiment, the metallic connecting pipe 7 envelops also the stabilizing coating layer of the connecting superconducting wire piece 5, in contrast to the first and the second embodiments in which the connecting metallic pipe 7 covers only the superconducting wires 1 and 2 to be connected. With this arrangement, it is possible to obtain a higher bonding strength because the metallic connecting pipe 7 can hold both the superconducting wires 1, 2 and the connecting superconducting wire piece 5.

Figure 6:
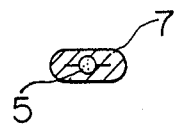
FIG. 6 is a sectional view taken along the line VI—VI of FIG. 5.

FIG. 6 is a sectional view showing the state of the connecting superconducting wire piece 5 held by the metallic connecting pipe 7 crimped thereon, taken along the line VI—VI of FIG. 5.

Although not shown, the third embodiment may be modified such that the filaments 6 of the connecting superconducting wire piece 5 are so extended as to lay between the stabilizing coating layers of the wires 1, 2 and the end of the metallic connecting pipe 7, thus attaining the same advantage as that offered by the second embodiment.

FOURTH EMBODIMENT

FIGS. 7 to 10 in combination show a fourth embodiment of the present invention in which the superconducting wires 1 and 2 are arranged and connected to each other coaxially so as to oppose each other, unlike the first to third embodiments in which the superconducting wires 1 and 2 to be connected are arranged in a side-by-side fashion.

Figure 7:
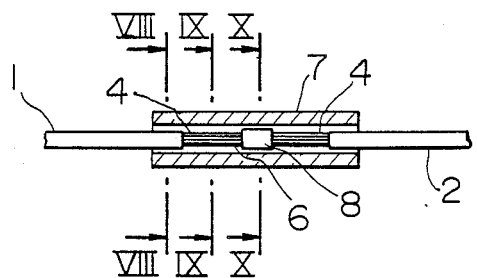
FIG. 7 is a sectional view showing the state of connection between superconducting wires connected by a fourth embodiment of the method in accordance with the present invention.

Referring first to FIG. 7, the superconducting wires 1 and 2 are positioned such that their filaments 4 and 4 oppose each other. Meanwhile, a connecting superconducting wire piece 8 is processed such that its filaments 6 are exposed at both its axial ends leaving the central portion of the stabilizing coating layer intact. The connecting superconducting wire piece 8 is placed such that its filaments 6 cross and envelope the filaments 4, 4 of the adjacent superconducting wires 1 and 2. In this case, therefore, the filaments 4 and 4 of the superconducting wires 1 and 2 are connected through the intermediary of the filaments 6 of the connecting superconducting wire piece 8.

Then, the metallic connecting pipe 7 is fitted so as to bridge between the superconducting wires 1 and 2 as illustrated, and is crimped so as to press bond the meshing filaments of the superconducting wires and the connecting superconducting wire piece. According to this method, it is possible to connect both superconducting wires 1 and 2 without causing any undesirable stress to occur in the superconducting wires after they are connected.

Figure 8:
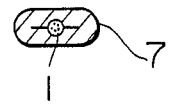
FIG. 8 is a sectional view taken along the line VIII—VIII of FIG. 7.
Figure 9:
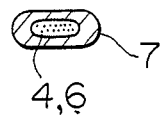
FIG. 9 is a sectional view taken along the line IX—IX of FIG. 7.
Figure 10:
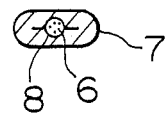
FIG. 10 is a sectional view taken along the line X—X of FIG. 7.

FIG. 8 is a sectional view of the superconducting wire 1 connected to the wire 2 by the metallic connecting pipe 7 crimped thereon, taken along the line VIII—VIII of FIG. 7, while FIG. 9 is a sectional view taken along the line IX—IX of FIG. 7 showing the filaments 4 and 6 which are pressed together by the metallic connecting pipe 7 crimped thereon. FIG. 10 is a sectional view taken along the line X—X of FIG. 7, showing the state of the connecting superconducting wire piece pressed by the metallic connecting pipe 7 crimped thereon.

FIFTH EMBODIMENT

Figure 11:
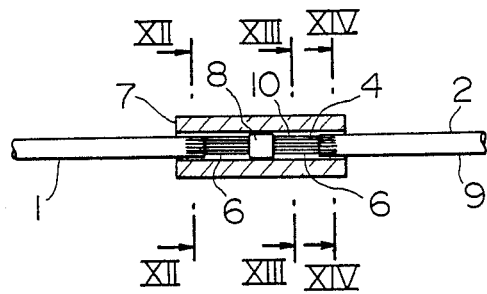
FIG. 11 is a sectional view showing the state of connection between superconducting wires connected by a fifth embodiment of the method in accordance with the present invention.
Figure 12:
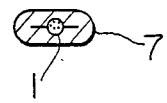
FIG. 12 is a sectional view taken along the line XII—XII of FIG. 11.
Figure 13:
FIG. 13 is a sectional view taken along the line XIII—XIII of FIG. 11.
Figure 14:
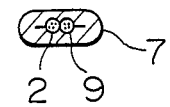
FIG. 14 is a sectional view taken along the line XIV—XIV of FIG. 11.
Figure 15:
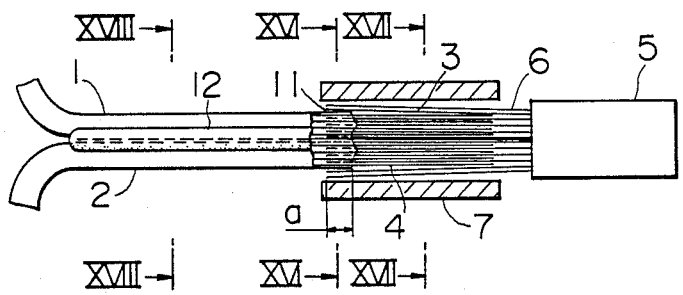
FIG. 15 is a sectional view showing the state of connection between superconducting wires connected by a sixth embodiment of the method in accordance with the present invention.
Figure 16:
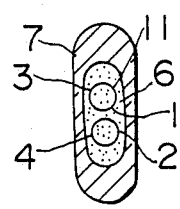
FIG. 16 is a view taken in the direction of arrow line XVI—XVI of FIG. 15.
Figure 17:
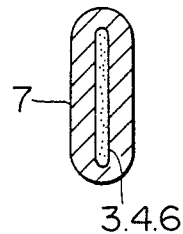
FIG. 17 is a view taken in the direction of arrow line XVII—XVII of FIG. 15.
Figure 18:
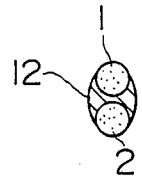
FIG. 18 is a view taken in the direction of arrow line XVIII—XVIII of FIG. 15.

FIGS. 11 to 14 show a fifth embodiment of the invention. The fifth embodiment is similar to the fourth embodiment but is distinguishable from the latter in that the superconducting wire 1 is connected not only to the superconducting wire 2 but also to an additional superconducting wire 9 which is disposed on the same side of the connection as the superconducting wire 2, as if the superconducting wire 1 is branched into the superconducting wires 2 and 9. In this embodiment, the filaments 6 of the connecting superconducting wire piece 8 are inserted such as to cross and surround the filaments 4 and 10 of the superconducting wires 1 and 2. As in the case of the second embodiment, the ends of the filaments 6 are extended to cover the stabilizing coating layer, thus attaining the same effect as that produced by the second embodiment. FIG. 12 is a sectional view taken along the line XII—XII of FIG. 11, showing the state of the superconducting wire 1 pressed by the metallic connecting pipe 7 crimped thereon, while FIG. 13 is a sectional view taken along the line XIII—XIII of FIG. 11 showing the state of the filaments 4, 6 and 10 pressed by the metallic connecting pipe 7 crimped thereon. Similarly, FIG. 14 shows the states of the superconducting wires 2 and 9 pressed by the metallic pipe 7 crimped thereon, in section taken along the line XIV—XIV of FIG. 11.

SIXTH EMBODIMENT

FIGS. 15 to 21 in combination show a sixth embodiment of the present invention. In this embodiment, the filaments 3 and 4 of the superconducting wires 1 and 2 are inserted into the filaments 6 of the connecting superconducting wire piece 5 so as to surround the filaments 6, such that the filaments 6 envelope the corners of the stabilizing copper 11 of the superconducting wires. Then, a connecting pipe 7 made of copper is fitted around the regions where the filaments 6 and the filaments 3, and 4 cross each other and is crimped by a press so as to tightly press and hold filaments 3, 4 and 6, thus causing these filaments to firmly contact and fix each other. In this embodiment, the superconducting wires 1 and 2 are integrated with each other by brazing at one side of the press-bonded portion, as denoted by 12 in FIG. 15. This structure will be more fully understood when reference is made to FIGS. 16, 17 and 18 which are sectional views taken along the lines XVI—XVI, XVII—XVII and XVIII—XVIII of FIG. 15.

Figure 20:
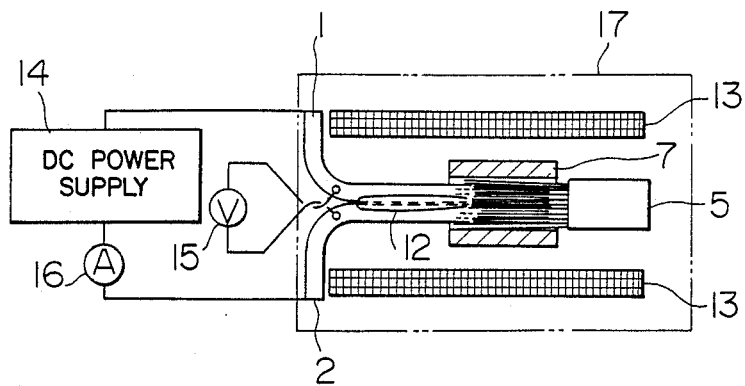
FIG. 20 is a circuit diagram of a test circuit for testing the characteristics of connection between superconducting wires connected by the method of the present invention.

A test was conducted using the structure shown in FIG. 20. Namely, a D.C. power supply 14, an ampere meter 16 and a volt meter 15 were set in a manner shown in FIG. 20, and the superconducting wires were placed in a cryostat 17. The connecting portion of these superconducting wires were cooled down to the temperature level of liquid helium, and the critical electric current value was measured under the influence of the magnetic field formed by a coil 13. The same test was conducted using superconducting wires connected by a conventional method and superconducting wires connected in the manner shown in FIG. 1C, namely, the connecting structure in which the end surfaces of the superconducting wires 1 and 2 and the end surface of the stabilizing copper layer are flat and the filaments 6 of the connecting superconducting wire piece 5 do not overlap the stabilizing copper layer and in which no brazing connection is made between the superconducting wires 1 and 2.

Figure 21:
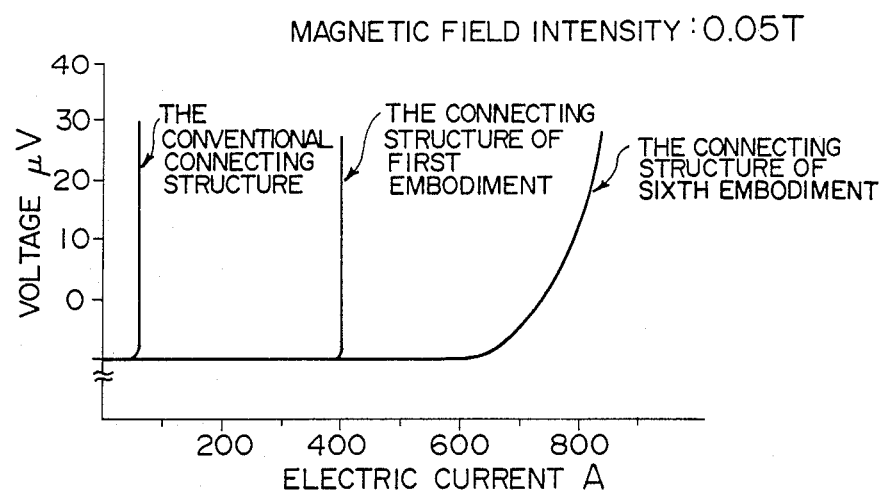
FIG. 21 is a characteristic chart illustrating another example of the effect produced by the invention.

FIG. 21 shows the result of this test, in which symbols A and $\mu V$ represent, respectively, the values of the electric current and the voltage which are read on the respective meters 16 and 15. As can be seen from this Figure, the connecting structure of the sixth embodiment showed the greatest critical current value, while the conventional connecting structure showed the smallest critical current value. The connecting structure shown in FIG. 1C showed an intermediate level between the values exhibited by the connecting structure of the sixth embodiment and the conventional connecting structure. An observation of the connecting portions after the test proved that no breakage of the filaments 3 and 4 was found in the connecting structure of the sixth embodiment, while the connecting structure shown in FIG. 1C and the conventional connecting structure showed breakage of some of the filaments 3 and 4.

Figure 19:
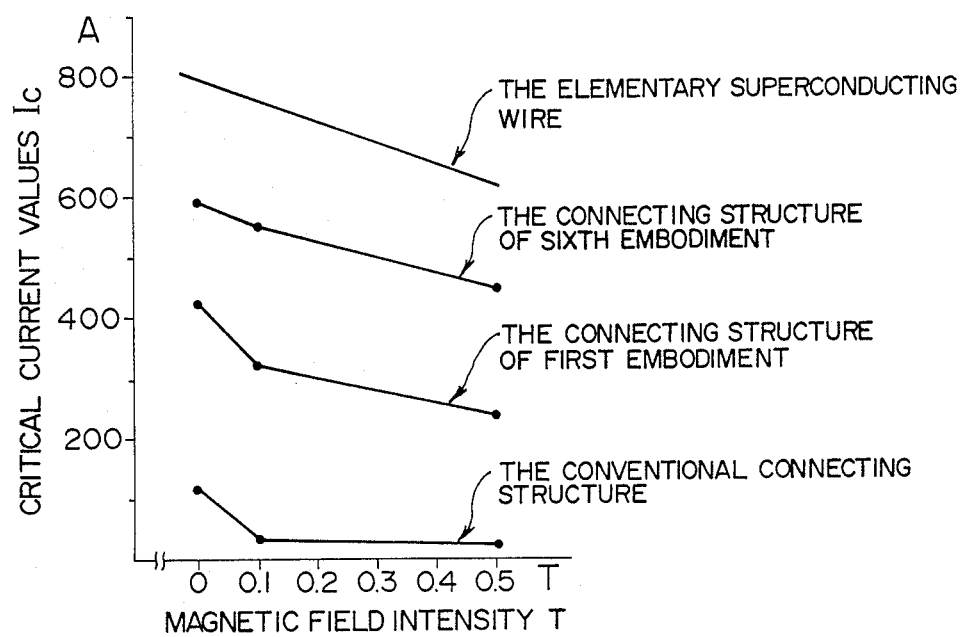
FIG. 19 is a characteristic chart illustrating an example of the effect produced by the invention.

In another test, the critical current values A were measured under the influence of the magnetic field the intensity T of which was varied within the range between 0 and 0.5 T, the result of which is shown in FIG. 19. As will be seen from this Figure, the connecting structure in accordance with the sixth embodiment showed the greatest critical current value regardless of the level of the magnetic field intensity, while the lowest critical current value was exhibited by the conventional connecting structure. The connecting structure shown in FIG. 1C showed an intermediate level of the critical current value.

From these facts, it will be understood that the connecting method in accordance with the present invention enables superconducting wires to be connected with high level of critical current value, because the risk for the filaments to be broken due to bonding pressure or due to supply of electric power is eliminated.

Figure 22:
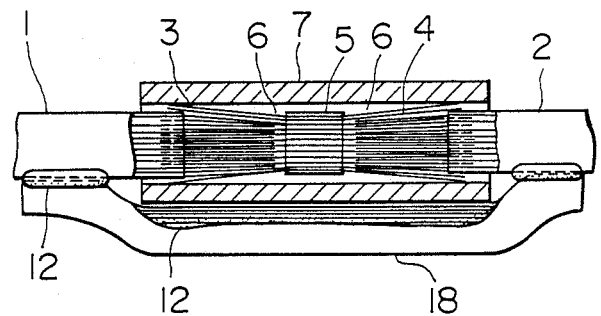
FIG. 22 is a sectional view showing the state of connection between superconducting wires connected by a seventh embodiment of the method in accordance with the present invention.
Figure 23:
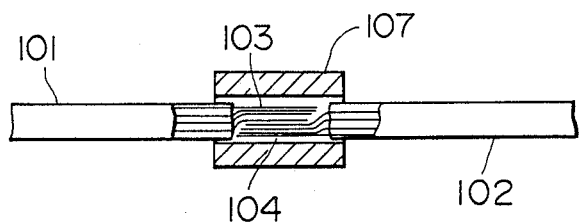
FIG. 23 is a sectional view showing a conventional method for connecting superconducting wires.

FIG. 22 shows a seventh embodiment of the invention in which the connecting superconducting wire piece 18 is brazed to the superconducting wires 1, 2 and the metallic pipe 7 at 12. This embodiment exhibits substantially the same characteristics as those shown by the connecting structure of FIG. 15.

As will be understood from the foregoing description, according to the present invention, it is possible to increase the electric current capacity and raise the mechanical strength by virtue of an increase in the closeness or tightness of contact and the area of contact between the superconducting wires to be connected. In addition, since the superconducting wires are connected tightly and fixedly without being accompanied by breakage of the superconducting filaments, the superconducting line composed of the superconducting wires connected to each other exhibits critical current characteristics and resistance approximating those of the superconducting wire element itself. In addition, the tendency for the filaments of the connected superconducting wires to be broken by the supply of electric power is suppressed appreciably.

What is claimed is:

1. A method of connecting superconducting wires each of which has a plurality of filaments covered by a coating layer, comprising the steps of:
   causing exposed filaments of a connecting superconducting wire piece to cross and surround the exposed filaments of said superconducting wires to be connected;
   covering the region where said filaments cross each other by a metallic connecting pipe; and
   crimping said metallic connecting pipe by a pressure thereby firmly connecting said filaments of said superconducting wires to each other.

2. A method of connecting superconducting layers according to claim 1, wherein said superconducting wires to be connected are laid side-by-side such that the exposed filaments thereof project in the same direction, and said exposed filaments of said connecting superconducting wire piece are disposed so as to oppose to said filaments of said superconducting wires and inserted such as to envelope said filaments of said superconducting wires.

3. A method of connecting superconducting wires according to claim 1 wherein said connecting superconducting wire piece has an electric current capacity greater than that of said superconducting wires to be connected.

4. A method of connecting superconducting wires according to claim 8 wherein said superconducting wires are further connected to each other by brazing thereby forming electrical connections between said superconducting wires through a brazed portion and through said exposed filaments rigidly connected by said metallic connecting pipe.

5. A method of connecting superconducting wires wherein each superconducting wire includes a plurality of filaments covered by a coating layer, comprising the steps of:
  causing exposed filaments of a connecting superconducting wire piece to cross and surround expected filaments of said superconducting wires to be connected;
  positioning extended ends of said exposed filaments of said connecting superconducting wire piece so as to cover an and portion of each coating layer of said superconducting wires to be connected;
  covering the region where said exposed filaments cross each other by a metallic connecting pipe having an end portion positioned so as to cover the extended ends of said exposed filaments of said connecting superconducting wire piece; and
  crimping said metallic connecting pipe by a pressure thereby firmly connecting said filaments of said superconducting wires to each other.

6. A method of connecting superconducting wires according to claim 5 wherein said superconducting wires to the-connected are laid side-by-side such that said exposed filaments thereof project in the same direction, and said exposed filaments of said connecting superconducting wire piece are disposed so as to oppose said exposed filaments of said superconducting wires and wherein said exposed filaments of said connecting superconducting wire piece are inserted so as to envelope said exposed filaments of said superconducting wires.

7. A method of connecting superconducting wires according to claim 5, wherein said connecting superconducting wire piece has an electric current capacity greater than that of said superconducting wires to be connected.

8. A method of connecting superconducting wires according to claim 5, wherein said superconducting wires are further connected to each other by brazing, thereby forming electrical connections between said superconducting wires through a brazed portion and through said exposed filaments rigidly connected by said metallic connecting pipe.

9. A method of connecting superconducting wires each of which has a plurality of filaments covered by a coating layer, comprising the steps of:
  causing exposed filaments of a connecting superconducting wire piece to cross and surround filaments of said superconducting wires to be connected;
  covering the region where said filaments cross each other by a metallic connecting pipe; and
  crimping said metallic pipe by a pressure thereby firmly connecting said filaments of said superconducting wires to each other;
  wherein the ends of said exposed filaments of said connecting superconducting wire piece are extended so as to cover adjacent end portions of each coating layer of said superconducting wires to be connected, and the ends of said metallic connecting pipe is positioned at a region covering said extended ends of said exposed filaments of said connecting superconducting wire piece.

* * * * *